(12) United States Patent
Matsunaga et al.

(10) Patent No.: US 11,108,248 B2
(45) Date of Patent: Aug. 31, 2021

(54) POWER SUPPLY SYSTEM INCLUDING HIGH-VOLTAGE SYSTEM AND LOW-VOLTAGE SYSTEM AND INSULATION THEREOF

(71) Applicant: Yazaki Corporation, Tokyo (JP)

(72) Inventors: Mototatsu Matsunaga, Makinohara (JP); Koichi Uezono, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 346 days.

(21) Appl. No.: 16/299,922

(22) Filed: Mar. 12, 2019

(65) Prior Publication Data
US 2019/0288523 A1  Sep. 19, 2019

(30) Foreign Application Priority Data
Mar. 13, 2018 (JP) .............................. JP2018-045237

(51) Int. Cl.
| | |
|---|---|
| H02J 7/00 | (2006.01) |
| G01R 31/382 | (2019.01) |
| H01M 10/42 | (2006.01) |
| H02M 3/335 | (2006.01) |
| B60L 58/22 | (2019.01) |

(52) U.S. Cl.
CPC ............ *H02J 7/0019* (2013.01); *B60L 58/22* (2019.02); *G01R 31/382* (2019.01); *H01M 10/425* (2013.01); *H02J 7/0014* (2013.01); *H02M 3/33523* (2013.01); *H01M 2010/4271* (2013.01); *H01M 2220/20* (2013.01)

(58) Field of Classification Search
CPC .... H02J 7/0014; H02J 7/0019; G01R 31/382; H01M 10/425; H01M 2010/4271; H02M 3/33523
USPC .......................................................... 320/134
See application file for complete search history.

(56) References Cited

U.S. PATENT DOCUMENTS

| | | | | |
|---|---|---|---|---|
| 8,896,146 | B2* | 11/2014 | Tran ........................ | B60L 58/20 307/10.1 |
| 2009/0033282 | A1* | 2/2009 | Ishikawa ............... | H02J 7/0018 320/122 |

(Continued)

FOREIGN PATENT DOCUMENTS

| | | |
|---|---|---|
| DE | 10 2014 201 362 A1 | 7/2015 |
| JP | 2010-213564 A | 9/2010 |

(Continued)

*Primary Examiner* — Nathaniel R Pelton
(74) *Attorney, Agent, or Firm* — Sughrue Mion, PLLC

(57) ABSTRACT

A power supply system including a low-voltage system and a high-voltage system having the high-voltage battery, that can provide an energy-efficient system of equalization of the high-voltage battery, is provided. The power supply system includes the high-voltage system having the high-voltage battery constituted of a plurality of battery cells, the low-voltage system, an insulation transmission part configured to transmit, in an insulated fashion, energy from each of the battery cells to the low-voltage system individually, and an equalization and transmission processing part configured to measure voltage of each of the battery cells, set a target battery cell to be processed for equalization, and control operation of the insulation transmission part and thereby transmit energy of the target battery cell to the low-voltage system.

4 Claims, 4 Drawing Sheets

(56) References Cited

U.S. PATENT DOCUMENTS

| | | | |
|---|---|---|---|
| 2013/0106320 A1 | 5/2013 | Yugo | |
| 2017/0001585 A1* | 1/2017 | Fink | ........................ B60L 58/21 |
| 2017/0098940 A1 | 4/2017 | Syouda | |

FOREIGN PATENT DOCUMENTS

| | | | |
|---|---|---|---|
| JP | 2012-75241 | A | 4/2012 |
| JP | 2012-120416 | A | 6/2012 |
| JP | 2013-5677 | A | 1/2013 |
| JP | 2013-099002 | A | 5/2013 |
| JP | 2015-119553 | * | 6/2015 |
| JP | 2015-119553 | A | 6/2015 |
| JP | 2015-171262 | A | 9/2015 |
| JP | 2016-25820 | A | 2/2016 |
| WO | 2016/151077 | A1 | 9/2016 |

* cited by examiner

A POWER SUPPLY SYSTEM INCLUDING HIGH-VOLTAGE SYSTEM AND LOW-VOLTAGE SYSTEM AND INSULATION THEREOF

FIELD OF THE INVENTION

The present disclosure relates to equalization of a high-voltage battery in a power supply system including a high-voltage system having the high-voltage battery and a low-voltage system.

BACKGROUND

In general, in addition to a high-voltage battery for traveling, a vehicle such as a hybrid vehicle and an electric vehicle is mounted with a low-voltage battery to supply power to low-voltage loads such as electronic control devices and electric devices. A 12V lead storage battery is widely used as the low-voltage battery.

The low-voltage loads to which electric power is supplied from the low-voltage battery are associated with functions such as traveling, steering, stopping, opening and closing of a door. These low-voltage loads can be divided into two types, loads for which it is desirable that supply of power is maintained during failure of the low-voltage battery (hereinafter called "backup loads"), and other loads (hereinafter called "regular loads").

Conventionally, a sub-battery is mounted to provide power supply redundancy for the backup loads. FIG. 4 is a block diagram showing an example of a configuration of a conventional power supply system including a redundant low-voltage battery. In this example, the power supply system includes a high-voltage system to which voltage of several hundred V is supplied from a high-voltage battery 510, and a low-voltage system to which voltage of 12V, for example, is supplied from a low-voltage battery 530. Although the high-voltage system and the low-voltage system are grounded independently, power can be transmitted and received between them via an insulation DC-DC converter 520.

The low-voltage system includes a regular load 540 and a backup load 550. A sub-battery 560 is connected to the backup load 550 via a relay 570. When the low voltage battery 530 fails, the relay 570 is turned on by a control device not shown, thereby maintaining supply of power to the backup load 550. The low-voltage system further includes a path for charging the sub-battery 560, and/or a DC-DC converter connected to the sub-battery 560 to convert voltage into 12V, for example.
Patent Literature 1: JP 2013-99002 A

SUMMARY OF THE INVENTION

As the high-voltage battery 510A, a lithium-ion battery pack, a nickel-hydride battery pack or the like is used. The battery pack is constituted of a plurality of secondary cells connected in series, thus the battery pack requires equalization of state of charge, e.g. charge capacity, to sufficiently exert its performance.

In the equalization of the cell voltages, a terminal voltage of each cell is measured and analyzed to monitor whether there is occurrence of variation in state of charge of the cells.

There are two types of equalization operations, a passive equalization and an active equalization. In the passive equalization, the cell with large charge capacity is selected and discharged to equalize the state of charge. On the other hand, in the active equalization, the cell with large charge capacity and the cell with small charge capacity are selected, and electrical charge of the cell with large charge capacity is transferred to the cell with small charge capacity to equalize the state of charge.

The passive equalization can be performed with a simple configuration and is popular, however it consumes electric power by discharging, wasting energy. On the other hand, the active equalization is energy-efficient, however it is not popular since it requires a complicated configuration which causes an increase in cost.

Therefore, there is a demand for a novel and energy-efficient equalization system. An object of the present invention is to provide a power supply system including a high-voltage system having the high-voltage battery and a low-voltage system, that provides a novel and energy-efficient system of equalization of the high-voltage battery.

To achieve the above-mentioned object, the present invention according to a first aspect provides a power supply system including a high-voltage system including a high-voltage battery having a plurality of battery cells, a low-voltage system, an insulation transmission part configured to transmit, in an insulated fashion, energy from each of the battery cells to the low-voltage system individually, and an equalization and transmission processing part, the equalization and transmission processing part being configured to measure voltage of each of the battery cells, set a target battery cell to be processed for equalization, and control operation of the insulation transmission part and thereby transmit energy of the target battery cell to the low-voltage system. The low-voltage system may include a low-voltage battery, and the equalization and transmission processing part may be configured to control operation of the insulation transmission part and thereby transmit energy of the target battery cell to the low-voltage battery. In this case, the low-voltage battery may be used as a sub-battery of the low-voltage system. Alternatively, the low-voltage system may include a low-voltage load, and the equalization and transmission processing part may be configured to control operation of the insulation transmission part and thereby transmit energy of the target battery cell to the low-voltage load. The insulation transmission part may include an insulation transformer. In this case, a switch is provided on a primary side of the insulation transformer, and the equalization and transmission processing part may control operation of the insulation transmission part by turning on and off the switch.

According to the present invention described above, the power supply system including the high-voltage system having the high-voltage battery and the low-voltage system that can provide a novel and energy-efficient system of equalization of the high-voltage battery, is provided.

DETAILED DESCRIPTION OF THE EXEMPLARY EMBODIMENTS

Figure 1:
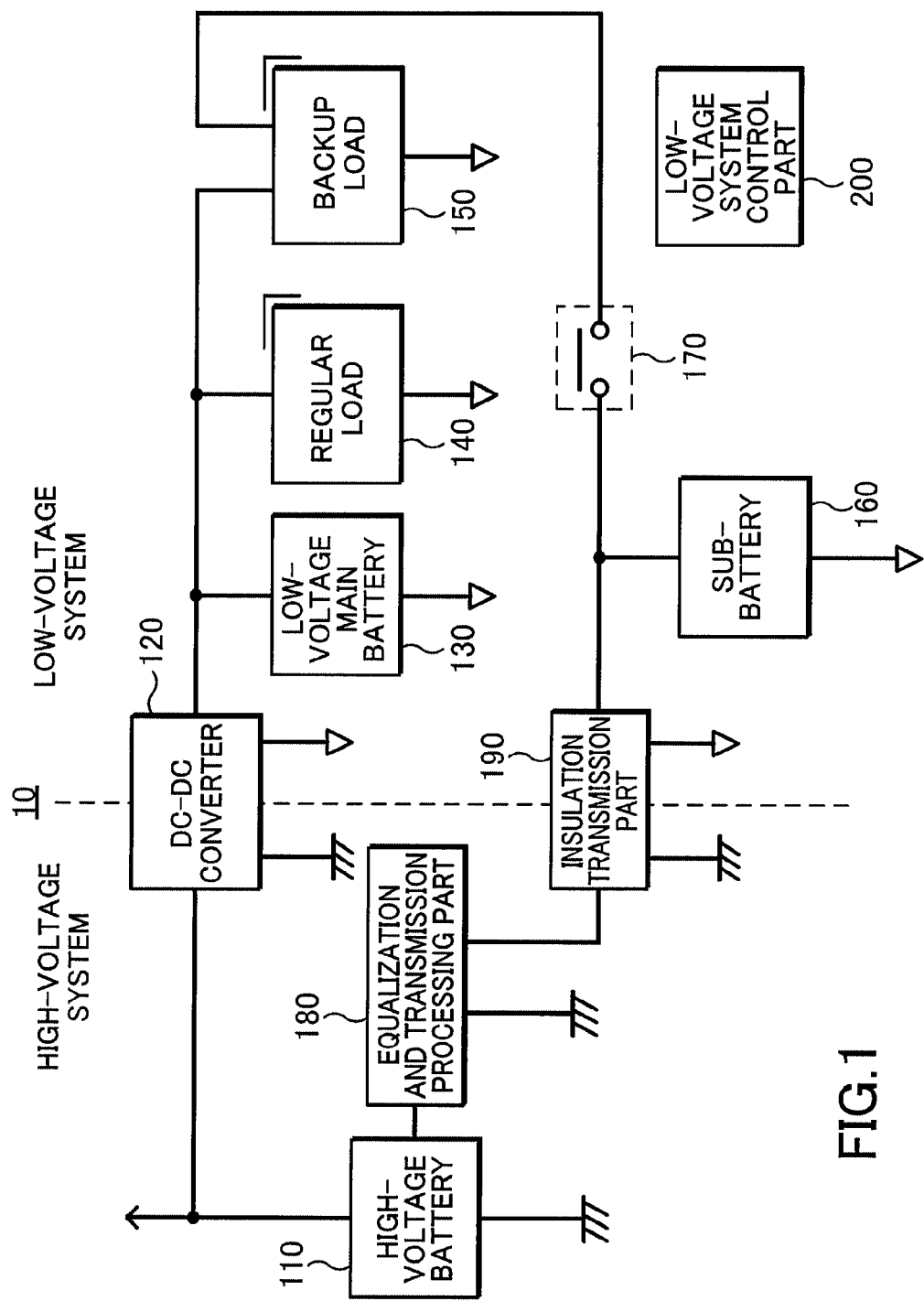
FIG. 1 is a block diagram showing a configuration of a power supply system according to one embodiment of the present invention.

The following will explain an exemplary embodiment of the present invention in reference to the drawings. FIG. 1 is a block diagram showing a configuration of a power supply system 10 according to this embodiment. The power supply system 10 is a power supply system of a vehicle such as a hybrid vehicle and an electric vehicle, and includes a high-voltage system having a high-voltage battery 110 for traveling and a low-voltage system.

The high-voltage battery 110 may include a lithium-ion battery pack, a nickel-hydride battery pack or the like having a plurality of secondary cells connected in series, and is configured to supply several hundred V voltage to the high-voltage system having a motor for traveling (not shown).

The high-voltage battery 110 requires equalization of state of charge, e.g. charge capacity, to sufficiently exert its performance. Thus, the high-voltage system is provided with an equalization and transmission processing part 180 that performs the equalization. As will be described later, when performing the equalization of the high-voltage battery 110, the equalization and transmission processing part 180 also performs transmission of energy of a target cell (i.e., a cell to be processed for equalization) to the low-voltage system via an insulation transmission part 190.

The low-voltage system of the power supply system 10 includes a low-voltage main battery 130. Although the high-voltage system and the low-voltage system are grounded independently, power can be transmitted and received between them via an insulation DC-DC converter 120.

The low-voltage main battery 130 may include a 12V lead storage battery, for example, and is configured to supply power to a general load 140 and a backup load 150. Herein, the backup load 150 relates to a function such as traveling, steering, stopping, opening and closing of a door. The backup load 150 is a low-voltage load for which it is desirable that supply of power is maintained during failure of the low-voltage main battery 130. The regular load 140 corresponds to a load other than the backup load (hereinafter called "regular loads").

Power supply redundancy is provided for the backup loads 150, that is, the backup loads 150 are also connected to a sub-battery 160 via a relay 170. A low-voltage system control part 200 is provided to control turn on and off of the relay 170. The sub-battery 160 may include a capacitor, a lead storage battery, a lithium-ion battery, a nickel-hydride battery and such. The relay 170 may be built into the sub-battery 160. Further, the low-voltage system control part 200 may be constituted of an ECU, for example.

Figure 2:
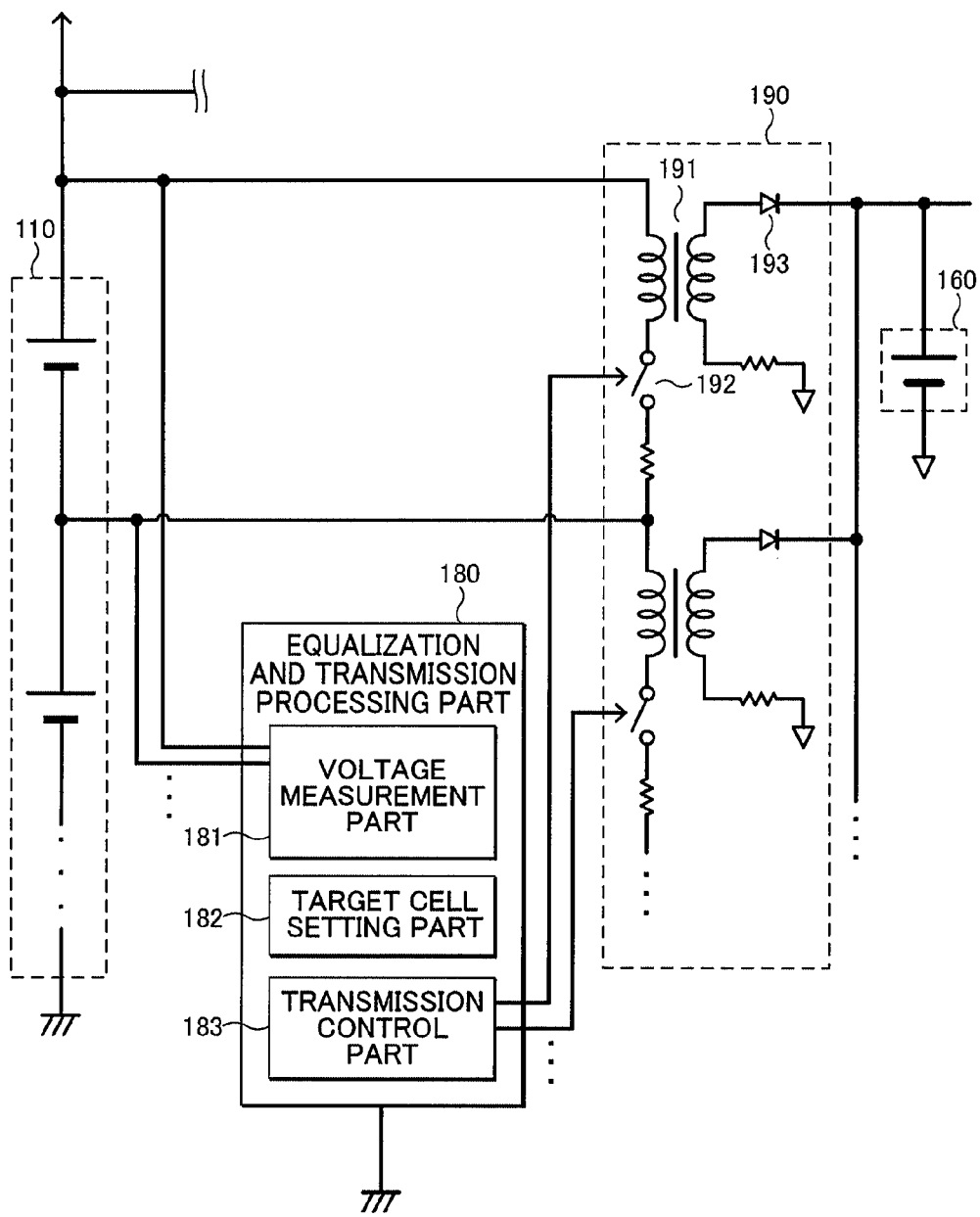
FIG. 2 is a diagram showing an exemplary configuration of an equalization and transmission processing part and an insulation transmission part.

FIG. 2 shows an exemplary configuration of the equalization and transmission processing part 180 and the insulation transmission part 190. As shown, the equalization and transmission processing part 180 includes a voltage measurement part 181, a target cell setting part 182 for setting the target cell to be processed for equalization, and a transmission control part 183. The equalization and transmission processing part 180 may be constituted of an IC, for example.

The insulation transmission part 190 includes an insulation transformer 191, a switch 192 and a diode 193 that are provided correspondingly to each cell of the high-voltage battery 110. A terminal of each cell is connected to a primary side of the insulation transformer 191 via the switch 192. A secondary side of each insulation transformer 191 is connected to the sub-battery 160 via the diode 193. In this manner, energy of each cell can be individually transmitted in an insulated fashion to the sub-battery 160. By providing the insulation transformer 191, the high-voltage system and the low-voltage system can be insulated with respect to each other. A smoothing capacitor may be connected to the secondary side.

The insulation transformer 191 has a voltage transformation ratio that allows transforming voltage of the cell to a voltage of the low-voltage system. In this manner, the sub-battery 160 can be applied with the voltage of the low-voltage system and charged. In another embodiment, a path switching circuit may be provided separately, and a set of insulation transformer 191, the switch 192 and the diode 193 may be used in common by each cell.

The voltage measurement part 181 of the equalization and transmission processing part 180 is connected to the terminals of each cell of the high-voltage battery 110, and is configured to measure voltage of each cell of the high-voltage battery 110. The target cell setting part 182 is configured to set the target cell to be processed for equalization, based on the measured voltages. A plurality of cells may be set as the target cells to be processed for equalization, and order of the target cells can be set in accordance with the level of the charge capacity, for example.

The transmission control part 183 performs on/off control, at a predetermined frequency, of the switch 192 corresponding to the target cell. This allows the energy of the target cell to be transmitted in an insulated fashion to the secondary side of the insulation transformer 191. The transmitted energy is accumulated in the sub-battery 160 via the diode 193.

That is, in this embodiment, in the equalization processing of the high-voltage battery, the energy of the cell with large charge capacity is transmitted in an insulated fashion, without being discharged, and is accumulated in the sub-battery 160 of the low-voltage system. Consequently, a novel and energy-efficient equalization system for the high-voltage battery is provided.

Figure 3:
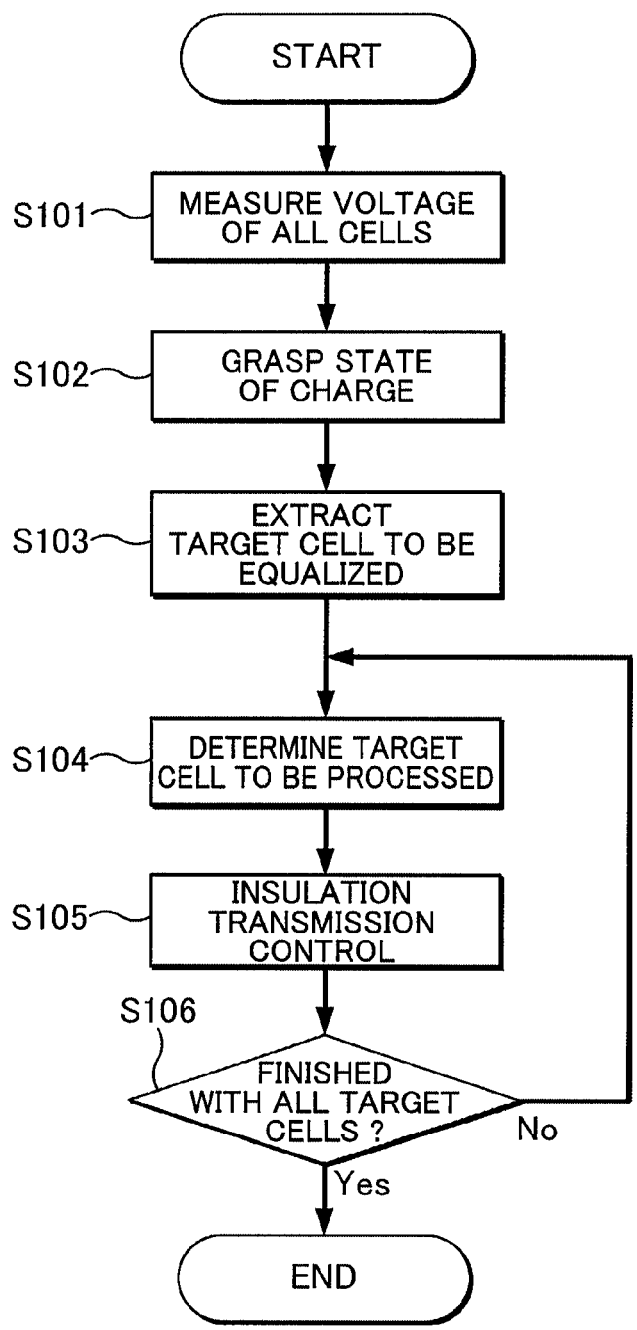
FIG. 3 is a flowchart illustrating operation of the equalization and transmission processing part.
Figure 4:
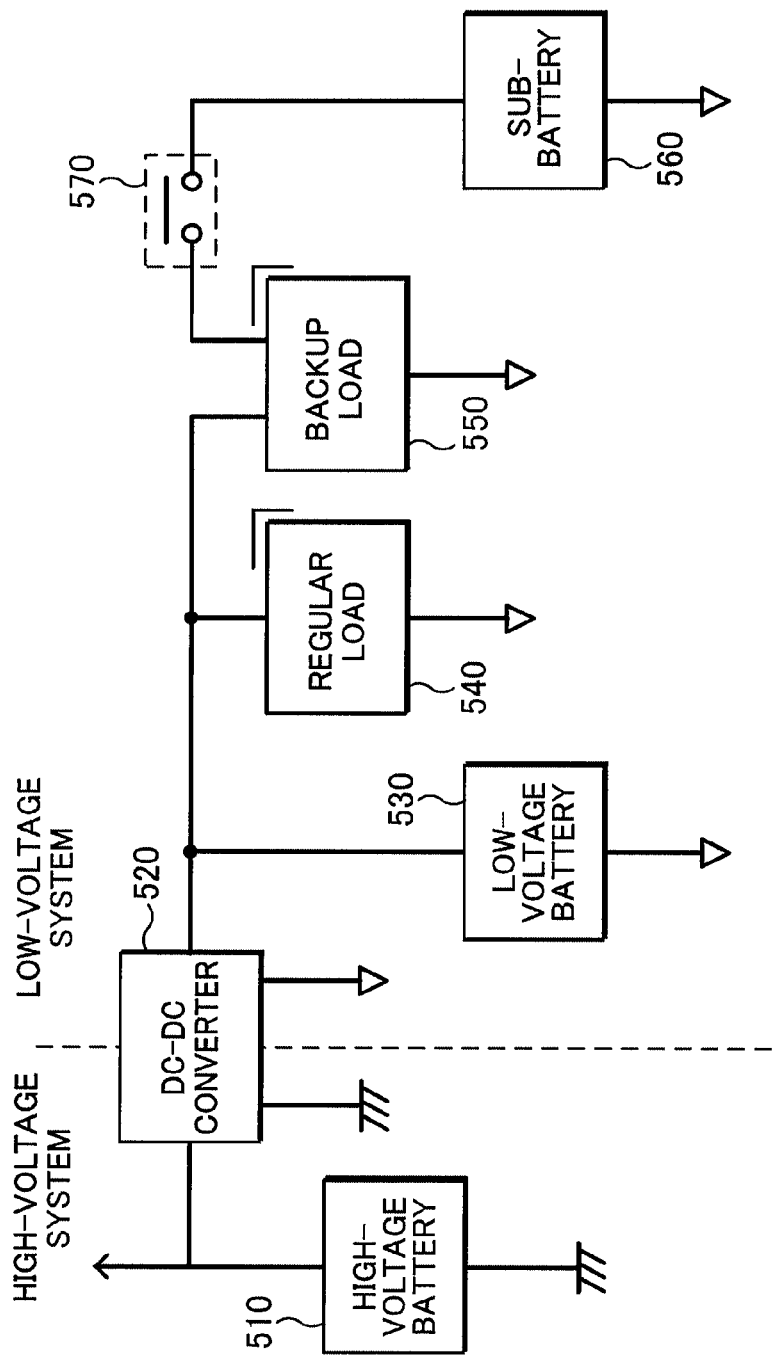
FIG. 4 is a block diagram showing a configuration of a conventional power supply system.

Next, operation of the equalization and transmission processing part 180 configured as described above will be explained in reference to the flowchart of FIG. 3. Firstly, the voltage measurement part 181 measures the voltage of each cell of the high-voltage battery at a predetermined timing (S101), and grasps the state of charge (S102).

Then, the target cell setting part 182 extracts target cells to be equalized based on the state of charge, e.g., the charge capacity (S103). For example, the cells other than the cell with the smallest charge capacity can be extracted as the target cells to be equalized. In this case, level of the charge capacity of each target cell is brought to a similar level with the charge capacity of the cell with the smallest charge capacity.

Then, the target cell setting part 182 determines, from the extracted target cells to be equalized, a target cell to be actually processed (S104). The equalization processing may be performed one cell at a time, or may be performed simultaneously for all target cells. When performing the equalization processing with one cell at a time, the target cell to be processed can be determined in descending order from the largest charge capacity.

Then, for the determined target cell to be processed, the equalization and transmission processing part 180 performs the insulation transmission processing (S105). In the insulation transmission control, a target cell voltage is determined. The target cell voltage may be a cell voltage corresponding to the charge capacity of the cell with the smallest charge capacity, for example.

The equalization and transmission processing part 180 monitors the cell voltage measured by the voltage measurement part 181, and performs the on/off control of the switch 192 until the cell voltage becomes the target voltage. In this manner, the energy is transmitted to the secondary side of the insulation transformer 191 and stored in the sub-battery 160. Frequency used to turn on and off the switch 192 may be fixed, or may be variable in accordance with difference from the target cell voltage or the state of charge of the sub-battery 160, for example.

The energy accumulated in the sub-battery 160 is utilized as a redundant power supply of the low-voltage system. Preferably, the low-voltage system control part 200 monitors voltage and/or the state of charge, etc., of the sub-battery 160, and if excessive charge of the sub-battery 160 is likely to happen, then the low-voltage system control part 200 turns on the relay 170 to supply power to the backup load 150. In another embodiment, a separate discharge circuit may be provided at a downstream of the sub-battery 160, so that the low-voltage system control part 200 can discharge the sub-battery 160 once it determines that there is excessive charge rate of the sub-battery 160. Alternatively, a DC-DC converter may be connected to the sub-battery 160 to convert battery voltage into desired voltage to utilize the power.

When performing the equalization processing with one cell at a time, the target cell to be processed is determined sequentially (S104), and the insulation transmission processing (S105) is performed repeatedly. Then, once the equalization processing is finished with all target cells ("Yes" in S106), the operation ends. Further, under the circumstance of lack of power in the low-voltage system, for example, the insulation transmission from each cell to the sub-battery 160 may be continued.

The invention has been described with respect to illustrative embodiments. However, the invention is not limited to the embodiments described above, and various changes and modifications may be made without departing from the spirit and scope of the invention. For example, the high-voltage battery 110, the equalization and transmission processing part 180, the insulation transmission part 190 and the sub-battery 160 may be integrally formed as a high-voltage battery unit.

Furthermore, in the embodiment described above, the transmitted energy was accumulated in the sub-battery 160 of the low-voltage system. However, the present invention is not limited to this, and the transmitted energy may be accumulated in the low-voltage main battery 130. Thus, all of the low-voltage batteries provided in the low-voltage system may be used to accumulate the energy.

Moreover, the energy transmitted to the low-voltage system may not be accumulated in the sub-battery 160 of the low-voltage system, instead it may be directly supplied to the regular loads 140 and/or to the backup loads 150 in the low-voltage system.

LIST OF REFERENCE SIGNS

10 power supply system
110 high-voltage battery
120 DC-DC converter
130 low-voltage main battery
140 regular load
150 backup load
160 sub-battery
170 relay
180 equalization and transmission processing part
181 voltage measurement part
182 target cell setting part
183 transmission control part
190 insulation transmission part
191 insulation transformer
192 switch
193 diode
200 low-voltage system control part

What is claimed is:

1. A power supply system comprising:
    a high-voltage system including a high-voltage battery having a plurality of battery cells;
    a low-voltage system including a main battery, a low-voltage load to which power is supplied from the main battery, and a sub-battery connected to the low-voltage load, the high-voltage system and the low-voltage system are configured such that power is capable of being transmitted and received between the high-voltage system and the low-voltage system via a DCDC converter;
    an insulation transmission part configured to transmit, in an insulated fashion, energy from each of the battery cells to the sub-battery of the low-voltage system individually; and
    an equalization and transmission processing part, the equalization and transmission processing part being configured to:
        measure voltage of each of the battery cells;
        set a target battery cell to be processed for equalization; and
        control operation of the insulation transmission part, and thereby transmit energy of the target battery cell to the sub-battery of the low-voltage system,
    wherein the sub-battery of the low-voltage system is configured to provide a redundant supply of energy to the low-voltage load at least in response to a determination of a charging of the sub-battery.

2. The power supply system according to claim 1, wherein the insulation transmission part includes an insulation transformer.

3. The power supply system according to claim 2, wherein a switch is provided on a primary side of the insulation transformer, and
    the equalization and transmission processing part controls operation of the insulation transmission part by turning on and off the switch.

4. The power supply system according to claim 1,
    wherein the equalization and transmission processing part is further configured to control operation of the insulation transmission part, and thereby transmit energy of the target battery cell to the sub-battery of the low-voltage system, based on determining that the voltage of the battery cells differs.

* * * * *